Aug. 6, 1957 G. C. SZIKLAI 2,802,065

CASCADE CONNECTED COMMON BASE TRANSISTOR AMPLIFIER
USING COMPLEMENTARY TRANSISTORS

Filed Feb. 13, 1953

INVENTOR
George C. Sziklai
BY H. L. Newton
ATTORNEY

United States Patent Office 2,802,065

Patented Aug. 6, 1957

2,802,065

CASCADE CONNECTED COMMON BASE TRANSISTOR AMPLIFIER USING COMPLEMENTARY TRANSISTORS

George C. Sziklai, Princeton, N. J., assignor to Radio Corporation of America, a corporation of Delaware Application February 13, 1953, Serial No. 336,753

4 Claims. (Cl. 179—171)

This invention relates generally to semi-conductor amplifiers and particularly to multi-stage cascade-coupled amplifiers of the semi-conductor type.

Semi-conductor devices, such as transistors, which are capable of amplifying signal energy, consist of a block of semi-conductive material, such as germanium or silicon, having at least three electrodes in contact with the semi-conductive block. These electrodes have been termed the emitter electrode, the collector electrode and the base electrode. Two principal classes of semi-conductor devices have been developed which have been referred to in the art as the point contact transistor and the junction transistor.

The junction transistor comprises a body of semi-conductive material, such as germanium or silicon, having two P-type regions, for example, separated by and contiguous with the opposite surfaces of an N type region. Electrical barriers, as discussed in U. S. Patent 2,569,347 to William Shockley, which issued on September 25, 1951, occur at the interfacial junctions. The base electrode is connected to the central region and the emitter and collector electrodes are connected to the end regions, respectively.

The point contact transistor includes a body of semi-conductive material which may be N or P type having a base electrode in low-resistance contact with the material and two or more closely spaced pointed electrodes in high-resistance or rectifying contact with the material. This type of device is described in U. S. Patent 2,524,035 to J. Bardeen et al. issued on October 3, 1950.

As is well known to those skilled in the transistor art, and as can be obtained from the reading of the two above identified patents, N-type point contact transistors and P–N–P junction transistors require bias potentials or voltages of identical polarity for a given type of operation, whereas P-type point contact transistors and N–P–N junction transistors require a like polarity of biasing potential for a given operation which is exactly opposite from that required in the N-type point contact transistor and the P–N–P type junction transistor. This feature of these opposite conductivity types has been utilized in the present invention in order to simplify biasing potential supply arrangements.

It is generally considered necessary when utilizing transistor amplifiers, to provide a bias potential source between the emitter electrode and the base electrode for biasing these electrodes in a relatively conducting polarity or in a forward direction. It is further usually necessary to provide an additional bias source connected between the collector electrode and the base electrode to bias these electrodes in a relatively non-conducting polarity or reverse direction. The direction or polarity of the bias potential in each of these two instances is considered to be the reason why the input impedance is low and why the output impedance is high.

It may also be noted that the magnitude of the two bias potentials or voltages required is considerably different, that is, the bias which is applied between the collector electrode and the base electrode is generally many times the static bias which is applied between the emitter electrode and the base electrode. From the above, it is readily seen that due to the polarity differences required in these bias voltages, and due to the difference in magnitude, it is generally considered necessary to provide two bias sources in a cascade-coupled amplifier. This, of course, is expensive and may also be bulky.

In a grounded-base transistor amplifier the input impedance may be in the order of 25 to 500 ohms, while the output impedance may be in the order of 10,000 ohms or more. Thus, it was generally considered necessary to utilize a step-down transformer between successive stages of a cascade amplifier utilizing semi-conductor amplifiers in a grounded-base type of circuit.

It can be seen from the above discussion that, if it is desired to cascade-couple two grounded-base transistor amplifier stages, a transformer or other impedance transforming means may be required due to the great variation in the impedance seen at either side of the coupling circuit. As is well known by those skilled in the electronic art, transformers are relatively costly and many times lead to design problems due to inherent phase shift and high frequency attenuation characteristics.

It is accordingly an object of the present invention to provide an improved multistage semi-conductor amplifier including simple and efficient interstage coupling circuits.

A further object of the present invention is to provide a direct-coupled semi-conductor amplifier circuit requiring only a single source of bias voltage for the output electrode of the driving transistor and the input electrode of the driven transistor.

It is a still further object of the present invention to provide an improved multistage semi-conductor amplifier capable of providing high amplification of radio frequency energy while requiring a minimum of interstage coupling elements.

A cascade-coupled semi-conductor amplifier, in accordance with the present invention, consists of two grounded-base transistor amplifier stages. Each amplifier stage includes a semi-conductor device provided with a base electrode, an emitter electrode and a collector electrode. A bias potential is impressed between the base and collector electrodes to bias them in a relatively non-conducting polarity or reverse direction, while the base and emitter electrodes are biased in a relatively conducting polarity or forward direction. A single parallel resonant tuned circuit is used as a coupling device and as an auto transformer for impedance transformation.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
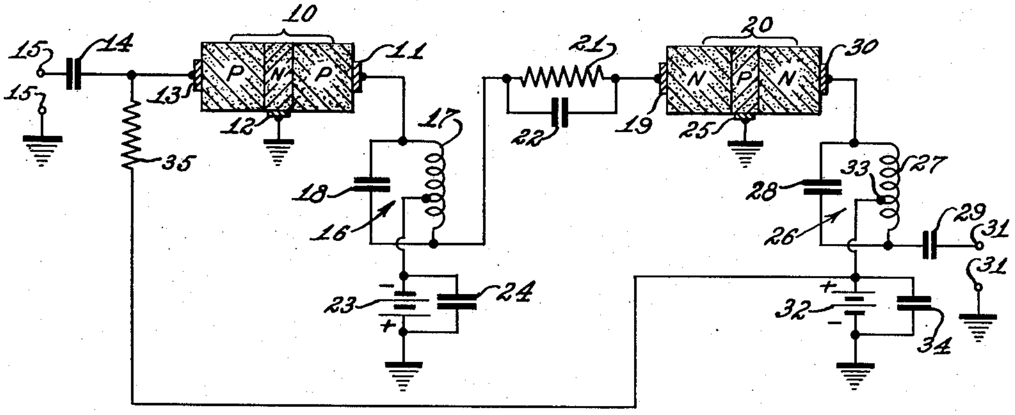
Figure 1 is a schematic diagram of a cascade-coupled junction transistor amplifier circuit of the grounded-base type in accordance with the present invention.

Referring now to the drawing, in which like reference characters identify like elements in the various figures, Figure 1 illustrates an embodiment of the invention in a two-stage amplifier which includes two junction transistors 10 and 20 which are of opposite conductivity types. For example, the driver transistor 10 is of the P–N–P type while the driven transistor 20 is of the N–P–N type.

The transistor 10 has a collector electrode 11 in contact with one P type zone, a base electrode 12 in contact with the intermediate N-type zone and an emitter electrode 13 in contact with the other P-type zone. An input coupling capacitor 14 is connected between the high voltage terminal of a pair of signal input terminals 15 and the emitter electrode 13 which functions as the input electrode. The other input terminal may be connected to a point of fixed reference potential such as ground for the system.

A parallel resonant circuit 16, comprising an inductor 17 and a shunt tuning capacitor 18, is connected in series with a bias resistor 21 between the collector electrode 11 of the driver stage transistor 10 and the emitter electrode 19 of the driven stage transistor 20. A bypass capacitor 22 may be connected in parallel with the bias resistor 21 in order to eliminate the effect of alternating currents on the voltage across the biasing resistor 21. The base electrode 12 of the junction transistor 10 is connected directly to ground.

A source of biasing or operating voltage such as a battery 23 is connected between an intermediate point on the inductor 17 and ground. This battery may be bypassed for alternating currents by a capacitor 24.

It is noted that the battery 23 is poled in a direction to provide the proper bias for the collector electrode of the junction transistor 10 and for the emitter electrode 19 of the junction transistor 20. If the two junction transistors were of opposite conductivity type from that shown, that is, if the junction transistor 10 were of the N-P-N type and the junction transistor 20 were of the P-N-P type, the polarity of the battery 23 would have to be reversed.

As will be more fully described hereinafter, the parallel resonant circuit 16 serves as a high impedance load for the collector electrode circuit of the first or driver stage junction transistor 10. In addition, the inductor 17, with its intermediate tap effectively connected at alternating current ground through the bypass capacitor 24, acts as an autotransformer to provide impedance matching between the collector electrode 11 of the junction transistor 10 and the emitter electrode 19 of the junction transistor 20. In other words, the input signal for the driven stage transistor 20 is applied between the emitter electrode 19 and the grounded base electrode 25, and comprises the signal which is developed across that portion of the inductor 17 lying between the grounded intermediate point and the end which is connected directly to the biasing resistor 21.

A second parallel resonant circuit 26 comprising an inductor 27 and a shunt tuning capacitor 28 is connected in series arrangement with an output or coupling capacitor 29 between the collector electrode 30 of the junction transistor 20 and the high voltage terminal of a pair of signal output terminals 31. The other of the pair of output terminals 31 is connected directly to ground.

A second source of biasing or operating voltage is illustrated as a battery 32 connected between an intermediate point 33 on the inductor 27 and ground. This battery also may be bypassed for alternating currents by a capacitor 34.

In order to provide proper operating bias for the emitter electrode 13 of the junction transistor 10, a bias resistor 35 is connected directly between the emitter electrode 13 and the positive terminal of the battery 32.

It is noted that the polarity of the battery 32 is opposite to that of the battery 23. This is required to provide the proper bias potentials for the emitter-base electrode circuit of the junction transistor 10 and the collector-base electrode circuit of the junction transistor 20. As is well known in the transistor art, it is usually required that for amplifier applications, the collector-base electrode circuit of transistors be biased in a relatively non-conducting direction and the emitter-base electrode circuit be biased in a relatively conducting direction. In other words, a reverse bias is applied between the collector and base electrodes and a forward bias is applied between the emitter and base electrode.

In order to better describe the biasing arrangement provided by the present invention, reference will first be made to the junction transistor 20 and its associated circuit elements. For the purpose of this description let it be assumed that the circuit is in a stable direct-current state and that no alternating current signal is being applied to the input terminals 15. In this condition, direct current will be flowing into the collector electrode 30 of the junction transistor 20, out of the emitter electrode 19 through the bias resistor 21, a portion of the inductor 17 and the battery 23 to ground. The voltage drop which will be produced across the bias resistor 21 due to this current flow is in such a direction so as to tend to make the emitter electrode 19 positive with respect to ground. It is noted that this voltage drop is in opposition to the polarity provided by the battery 23 which is connected in series with the bias resistor 21.

The voltage of each of the two batteries 32 and 23 may be in the order of approximately 6 volts for the present example. The ohmic value of the bias resistor 21 may then be selected to provide a voltage drop across it which is approximately but not quite the same magnitude as the voltage provided by the battery 23. In view of this it can be seen that the actual potential existing between the emitter electrode 19 and the base electrode 25, in a steady state condition, will be in a forward direction and of a magnitude which is determined by the difference between the voltage drop across the bias resistor 21 and the voltage of the battery 23. The resulting bias voltage for normal transistor amplifier operation in the system of the present example may be of the order of one tenth of a volt.

Referring to the bias supply circuit for the junction transistor 10, it will be noted that the current flow for this circuit is into the emitter electrode 13, out of the collector electrode 11 through the inductor 17 and the battery 23 to ground. In the same manner as above discussed in connection with the bias circuit for the junction transistor 20, a proper bias voltage is provided for the emitter base electrodes 13 and 12 of the junction transistor 10 by means of the bias resistor 35 and the battery 32 connected in series arrangement between the emitter electrode 13 and ground. As above discussed, the current flow through the bias resistor 35 is in such a direction so as to provide a voltage drop which is in opposing polarity to the voltage provided by the battery 32. Again the ohmic value of this bias resistor 35 is selected to provide a voltage drop which is only slightly less than the voltage provided by the battery 32 and, accordingly, a forward bias in the order of a tenth of one volt may be assumed to exist between the emitter electrode 13 and the base electrode 12.

It is thus seen that with the bias arrangement as provided in accordance with the present invention, there is no requirement for a floating battery as may be required by many of the prior art circuits. Further, there is a simplification in the bias requirements in that a single battery and a resistor provide the proper bias for the collector electrode circuit of one transistor and at the same time a proper bias for the emitter electrode circuit of another transistor which is connected in cascade with the first transistor. It is, of course, to be understood that the teachings of the present invention are not limited to two transistors in cascade as is shown in the drawing, but that this is merely for the purpose of illustration and that any number of stages may be placed in cascade in accordance with the present invention.

It will now be seen that in addition to the simplicity of the bias arrangement, the present invention provides a coupling circuit which enables the optimum transfer of signal energy with a minimum number of circuit components.

It is well known to those skilled in the transistor art that the collector electrode circuit of a transistor amplifier requires for impedance matching purposes a higher impedance load, presently in the order of tens of thousands of ohms, and for impedance matching purposes the load which is presented to the emitter electrode circuit is lower, being presently of the order of tens or hundreds of ohms. This requirement for impedance transformation and the consequent efficient operation when the requirement is met, is provided in the present embodiment of the invention by the parallel resonant tuned circuit 16, which is connected in the collector electrode circuit of the junction transistor 10.

A parallel resonant tuned circuit offers at or near its resonant frequency a very high impedance in the circuit in which it is connected. Accordingly, there is presented to the collector electrode circuit a high impedance which is commensurate with the requirements for the operation of the junction transistor 10. On the other hand, the low impedance required by the emitter electrode circuit of the junction transistor 20 is at the same time provided by utilizing the inductor 17 as an autotransformer.

While an auto transformer is a single tapped inductance, it may be treated as a double wound transformer, that is, one having a separate primary winding and a separate secondary winding. In these instances the primary winding is considered to have a number of turns equal to those provided by the entire inductance, if the autotransformer is used in a step-down arrangement, and the secondary winding is considered to have the number of turns existing between the intermediate tap and the lower potential end of the inductor. It is accordingly seen that there is an impedance transformation existing when an auto transformer arrangement is used which is normally considered to be the ratio of the impedances offered by the windings as above discussed. Further, in view of the fact that the inductor 17 is utilized as a step-down transformer, there will be a current amplification in accordance with transformer theory.

It is, of course, well known in the transistor art that a transistor is a current operated device rather than a voltage operated device such as is an electron tube, and accordingly this current amplification which is provided by the coupling arrangement in accordance with the present invention is an additional desirable feature. It is, of course, further understood that the use of the step-down transformer as above described will be attended by a step down in voltage. However, this is of no consequence in view of the fact as above mentioned that the transistor is a current operated device, and accordingly it is current gain that is to be obtained.

It is thus seen that if an input signal is applied to the input electrodes 15, which is of a frequency to which the parallel resonant circuit 16 is tuned, there will be developed across the output portion of the inductor 17 an amplified signal, from a current standpoint, which is applied to the input electrodes of the transistor 20. This signal will, accordingly, cause an output signal to be developed in the collector electrode circuit 30 of the transistor 20 which may be applied to any suitable means by connection to the output terminals 31.

Figure 2:
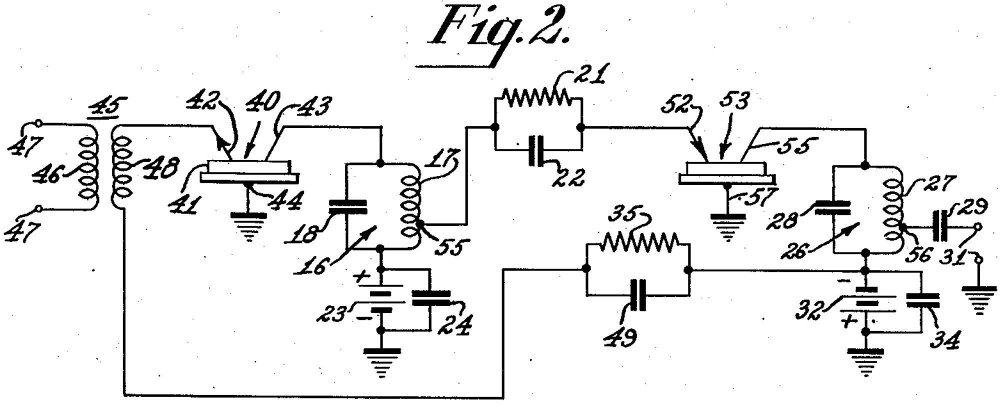
Figure 2 is a schematic circuit diagram of a cascade-coupled point contact transistor amplifier circuit of the grounded base type in accordance with the present invention.

In Figure 2 of the drawing there is shown a modification of the cascaded amplifier shown in Figure 1, utilizing transformer input coupling and point contact transistors. The coupling and biasing circuit as provided by the present invention is particularly applicable to point contact transistors in view of the fact that this type of transistor is generally considered to be not short circuit stable. In other words, since the point contact transistor is a current multiplication device there is considerable base current. Accordingly, the device exhibits a negative resistance characteristic which may be overcome by utilizing a sufficiently high external resistance. Consequently, in amplifier applications, it has become the practice to utilize the point contact transistor as an emitter input device whereas the junction type of transistor can be readily used as a base input device. However, it is to be understood that the various aspects and features of the present invention are readily applicable to either type of transistor as shown.

In the amplifier of Figure 2, a first point contact transistor 40 includes a semi-conductive body 41 of P-type material, an emitter electrode 42 and a collector electrode 43 in rectifying contact with the semi-conductive body 41, and a base electrode 44 in ohmic contact with the semi-conductive body 41. In this instance the input circuit is provided with an input transformer 45 comprising a primary winding 46 having a pair of signal input terminals 47 connected therewith and a secondary winding 48, one end of which is connected to the emitter electrode 42 and the other end of which is connected to one end of a biasing resistor 35. In order to prevent alternating currents from affecting the voltage drop across the biasing resistor 35, it may be bypassed by a suitable capacitor 49.

In the embodiment discussed in connection with Figure 1 of the drawing, the bias resistor 35 was not bypassed by a capacitor, as in that embodiment a bypass capacitor would have constituted a short circuit for alternating currents across the input terminals 15. However, since in the circuit of Figure 2 transformer input it utilized, it may be desirable to provide such a bypass capacitor in parallel with the bias resistor 35.

As above discussed in connection with Figure 1, a parallel resonant tuned circuit 16, comprising an inductor 17 and a shunt tuning capacitor 18, is connected between the collector electrode 43 and the positive terminal of a source of operating or biasing voltage, such as a battery 23, which may be shunted by a bypass capacitor 24 for alternating currents.

In order to provide the proper operating bias voltage for the emitter electrode 52 of the point contact transistor 53, a bias resistor 21 which operates substantially as described in connection with the circuit of Figure 1 is connected in series arrangement between the emitter electrode 52 and a tap 55 on the inductor 17. This bias resistor may, of course, also be bypassed for alternating currents by a capacitor 22.

The output circuit for the point contact transistor 53 comprises a second parallel resonant tuned circuit 26, including an inductor 27 and a shunt tuning capacitor 28 connected in series between the collector electrode 55 of the point contact transistor 53 and the negative terminal of a second source of biasing or operating voltage which is illustrated as a battery 32. A bypass capacitor 34 is provided in shunt with the battery 32 to effectively ground the negative terminal of the battery 32 for alternating current signals. An output circuit is provided by means of a coupling capacitor 29 connected between a tap 56 on the inductor 27 and the high voltage terminal of a pair of signal output terminals 31. The other of the pair of output terminals 31 is connected directly to ground. In order to complete the input and output circuits for transistor 53, the base electrode 57 is connected directly to ground.

It is noted that the polarity of the batteries 23 and 32 as illustrated in Figure 2 is opposite to the polarity of the same batteries as illustrated in Figure 1. This is required in order to provide proper biasing for the point contact transistors 40 and 53. In view of the fact that the point contact transistor 40 is of the P-type and that as above discussed in normal amplifier operation a reverse bias is required between the collector electrode 43 and the base electrode 44, the collector electrode 43 must be made positive with respect to the base electrode 44. It is then evident that the same reverse in polarity is required of the battery 32 in view of the fact that the point contact transistor 53 is of the N-type.

The operation of the bias arrangement, as illustrated in Figure 2, is substantially identical to that shown in Figure 1. However, it is noted that the direction of the steady state direct current flow is in the opposite direction in the transistor 53 from that in the transistor 20 of Figure 1. That is, current will flow into the emitter electrode 52, out of the collector electrode 55, through the inductor 27, the battery 32, the battery 23, the bias resistor 21, and back to the emitter electrode 52. It is, however, readily seen that the voltage drop which is developed across the bias resistor 21 due to the steady state current flow through it will be as above discussed in opposite polarity to the voltage of the battery 23.

Here, as in the preceding example, the ohmic value of the bias resistor 21 is selected to provide a voltage drop which is in the order of a tenth of a volt less than the voltage provided by the battery 23, and accordingly the resultant voltage which is applied between the emitter electrode 52 and the base electrode 57 will be in the order of a tenth of a volt in a forward direction.

It is also seen that the same operation applies to the biasing arrangement for the emitter electrode and base electrode of the transistor 40. Current flows into the collector electrode 43 and out of the emitter electrode 42, through the secondary winding 48 of the input transformer 45, the bias resistor 35, and the battery 32. Accordingly, there is developed across the bias resistor 35 a voltage drop which, if the ohmic value of the bias resistor 35 is properly selected, will approximately be equal to the voltage of the battery 32. It is thus seen that with the proper selection of the bias resistor 35, a forward bias of the proper magnitude will be applied to the emitter-base electrodes of the point contact transistor 40.

In the present circuit of Figure 2, insofar as signal or alternating current operation is concerned, the operation is essentially identical to that of Figure 1. If an alternating current signal is applied to the input terminals 15, it will, by transformer action, be applied between the emitter electrode 42 and the base electrode 44 of the transistor 40, and accordingly an output signal will be developed in the parallel resonant circuit 16 which is coupled to the collector electrode 43. It is then readily seen that by autotransformer action as discussed in connection with Figure 1 an input signal will be applied to the emitter base electrode circuit of the point contact transistor 53 which will, in turn, cause an output signal to be developed in the parallel resonant tuned circuit 26. This output signal is utilized by connecting any suitable means to the output terminals 31.

It is, of course, to be understood that the transistor amplifier provided in accordance with this invention may be applied to various series and parallel transistor arrangements.

It will be appreciated that while this invention has been described by reference to point contact and junction transistors that it is in no way limited to transistors of the specific forms shown. Other types which have operating characteristics which are in accordance with those above described, may also be used in the practice of this invention even though they may differ in the detailed manner by which they are controlled.

It can thus be seen that the present invention provides a transistor amplifier circuit which is capable of amplifying by cascade operation an alternating current signal while utilizing a minimum of circuit elements and at the same time providing for highly efficient operation. Furthermore, there is no requirement for floating sources of operating voltages as is required in many of the prior art circuits.

What is claimed is:

1. A semi-conductor circuit comprising a pair of semi-conductor devices of opposite conductivity type, each including three electrodes, a first of said electrodes of each of said semi-conductor devices being connected to a point of fixed reference potential, signal input means coupled to impress an input signal between said point of fixed reference potential and a second of the electrodes of one of said pair of semi-conductor devices, output means coupled to a second of said electrodes of the other of said pair of semi-conductor devices, a source of bias potential of predetermined polarity having a pair of terminals one of which is connected to said point of reference potential, direct current conductive and frequency selective coupling means including an inductor connected between the third of said electrodes of said one semi-conductor device and the other terminal of said source of bias potential to provide impedance transformation and current amplification between said devices, and an impedance element direct-current conductively connected between said coupling means and the third of said electrodes of the said other of said pair of semi-conductor devices to provide a direct-current conductive path through said inductor between the third electrode of said one semi-conductor device and the third electrode of the other of said pair of devices, said impedance element being adapted to be traversed by the direct current through said other of said devices thereby to develop a voltage of opposite polarity to the polarity of said source.

2. A semi-conductor circuit comprising a pair of semi-conductor devices of opposite conductivity type, each including an input electrode, an output electrode and a common electrode, said common electrode of each of said semi-conductor devices being connected to a point of fixed reference potential, signal input means coupled to impress an input signal between said point of fixed reference potential and the input electrode of one of said pair of semi-conductor devices, direct current conductive impedance transformation means including a parallel resonant circuit direct-current conductively connected to the output electrodes of each of said pair of semi-conductor devices, a source of bias potential having a predetermined polarity connected between each of said impedance transformation means and said point of fixed reference potential, and an impedance element respectively direct-current conductively connected between each of said impedance transformation means and the input electrode of the other of said semi-conductor devices, said impedance elements being adapted to be traversed by the input electrode currents through each of said pair of semi-conductor devices to develop a voltage of opposite polarity to each of said sources thereby to determine the resultant bias on each of said input electrodes.

3. A cascade-coupled semi-conductor signal amplifier circuit, comprising in combination, a first semi-conductor device of one conductivity type including a first semi-conductive body, a first input electrode, a first output electrode and a first common electrode each in contact with said first semi-conductive body, a second semi-conductor device of an opposite conductivity type including a second semi-conductive body, a second input electrode, a second output electrode, and a second common electrode each in contact with said second semi-conductive body, input circuit means coupled between said first input electrode and said first common electrode for applying signal energy thereto, a parallel resonant tuned circuit direct-current conductively connected to said first collector electrode and including an inductor having an intermediate tap, means providing a direct-current supply source having a pair of terminals, means connecting said parallel resonant circuit with one of said terminals, circuit means connected between said intermediate tap on said inductor and said second input electrode for impressing amplified signal energy thereon and providing a direct-current conductive path between said first output electrode and said second input electrode through said inductor, an output circuit direct-current conductively connected to said second output electrode and comprising a second parallel resonant tuned circuit including a second inductor having an intermediate tap, means connecting said second parallel resonant circuit with the other of said terminals of said supply source, a pair of output terminals connected effectively across a portion of said second inductor, and means providing operating bias potential for said input electrodes comprising an impedance element connected to each of said input electrodes and adapted to be traversed by signal responsive currents flowing through each of said semi-conductor devices thereby to establish operating bias potential respectively for each of said devices.

4. A cascade-coupled signal amplifier circuit comprising a first individual transistor of one conductivity type including a first emitter, a first base, and a first collector electrode, input circuit means connected for applying an input signal between said emitter and base electrodes, a second individual transistor of an opposite conductivity type having a second emitter, a second base, and a second collector electrode, means providing a direct-current supply source having a pair of terminals, first direct-current conductive means including an inductor connecting said first collector electrode with one of said terminals, a capacitor connected in parallel with said inductor and forming a parallel resonant circuit therewith, second direct-current conductive means connecting said inductor with said second emitter electrode, said first and second direct-current conductive means providing a direct-current conductive connection through said inductor between said first collector electrode and said second emitter electrode, and third direct-current conductive means connecting said second collector electrode with the other terminal of said source, said third direct-current conductive means including output circuit means for deriving an output signal between said second collector and second base electrodes.

References Cited in the file of this patent

UNITED STATES PATENTS

| | | |
|---|---|---|
| 2,517,960 | Barney et al. | Aug. 8, 1950 |
| 2,595,496 | Webster | May 6, 1952 |
| 2,652,460 | Wallace | Sept. 15, 1953 |
| 2,660,624 | Bergson | Nov. 24, 1953 |
| 2,666,818 | Shockley | Jan. 19, 1954 |
| 2,666,819 | Raisbeck | Jan. 19, 1954 |
| 2,691,074 | Eberhard | Oct. 5, 1954 |
| 2,729,708 | Goodrich | Jan. 3, 1956 |

FOREIGN PATENTS

| | | |
|---|---|---|
| 665,867 | Great Britain | Jan. 30, 1952 |
| 684,879 | Great Britain | Dec. 24, 1952 |

OTHER REFERENCES

Text, "The Transistor," page 155, pub. 1951 by Bell Tel. Labs., Inc.,

Harold, N. Y. abstract Ser. No. 68,347, published May 22, 1951.